United States Patent [19]

Abe et al.

[11] Patent Number: 4,814,930

[45] Date of Patent: Mar. 21, 1989

[54] OPTICAL ZERO-PHASE CURRENT AND ZERO PHASE VOLTAGE SENSING ARRANGEMENT

[75] Inventors: Masanori Abe, Tokyo; Syunzo Mase, Aichi; Yoshinari Kozuka, Nagoya, all of Japan

[73] Assignee: NGK Insulators, Ltd., Aichi, Japan

[21] Appl. No.: 46,173

[22] Filed: May 5, 1987

[30] Foreign Application Priority Data

May 20, 1986 [JP] Japan ................................ 61-113770

[51] Int. Cl.⁴ .............................................. H02H 3/08
[52] U.S. Cl. ........................................ 361/44; 361/47; 324/96; 250/227
[58] Field of Search ..................... 361/42, 44, 45, 47, 361/91, 93; 324/96, 97; 250/227; 350/376, 374

[56] References Cited

U.S. PATENT DOCUMENTS

| | | |
|---|---|---|
| 3,324,393 | 6/1967 | Casey et al. .......................... 350/376 |
| 3,786,311 | 1/1974 | Hobson et al. ........................ 361/44 |
| 4,510,441 | 4/1985 | Yasuda et al. ........................ 324/96 |
| 4,578,639 | 3/1986 | Miller ...................................... 324/96 |
| 4,631,402 | 12/1986 | Nagatsuma et al. ............... 324/96 X |
| 4,683,421 | 7/1987 | Miller et al. ............................ 324/96 |
| 4,755,665 | 7/1988 | Ulmer, Jr. et al. .................... 324/96 |

Primary Examiner—A. D. Pellinen
Assistant Examiner—H. L. Williams
Attorney, Agent, or Firm—Parkhurst, Oliff & Berridge

[57] ABSTRACT

An apparatus for detecting an accident of electric wire lines a single light emitting element, a plurality of optical sensor heads arranged respectively to the lines to be observed, for modulating a light supplied form the light emitting element through a light transmission line in response to electric variations in the line, and a single light receiving element for receiving the synthetic light. Therefore, since the light transmission line is used instead of electric wires, the apparatus has good insulation characteristics and thus the apparatus is not affected by an electromagnetic induction from the electric wire lines. Moreover, since use is made of single light emitting element and single light receiving element, high S/N ratio is realized.

9 Claims, 4 Drawing Sheets

FIG_1
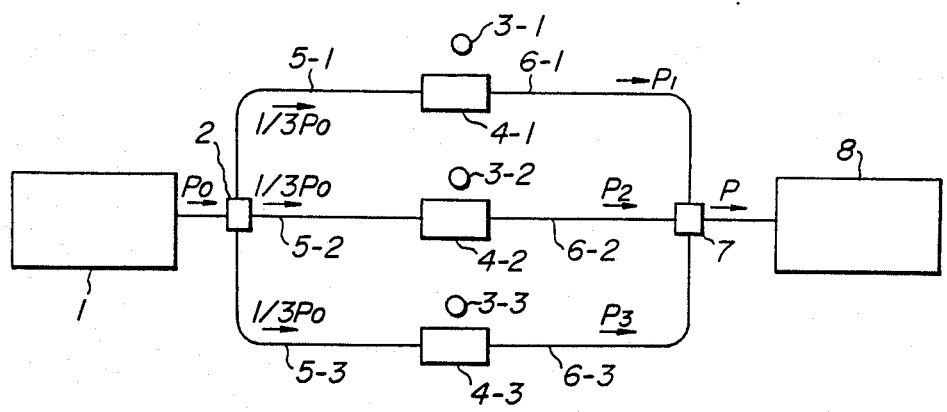

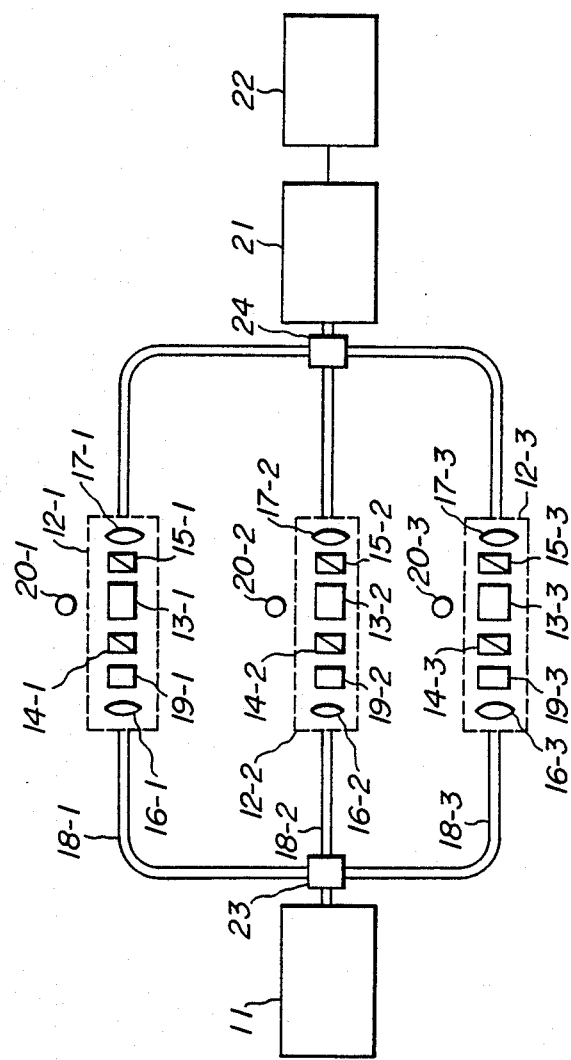

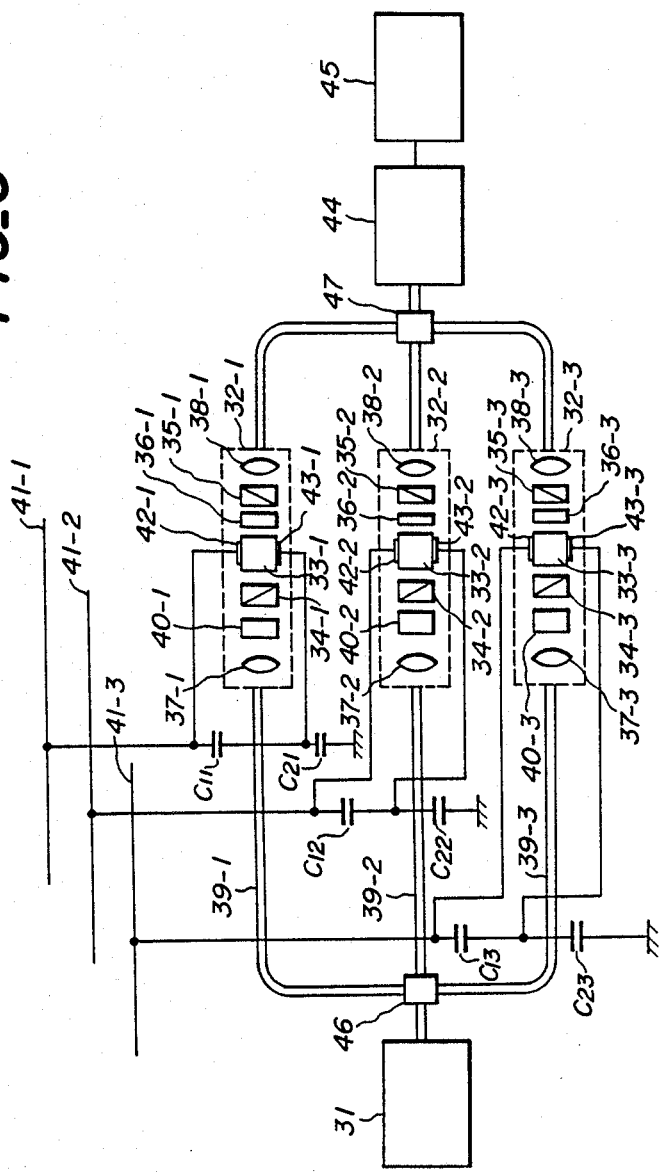
FIG_3

FIG_4
PRIOR ART
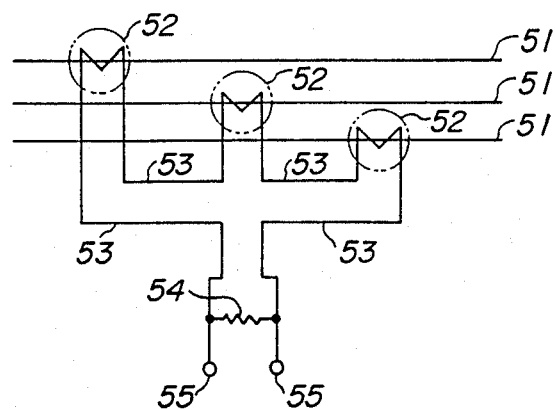
FIG_5
PRIOR ART
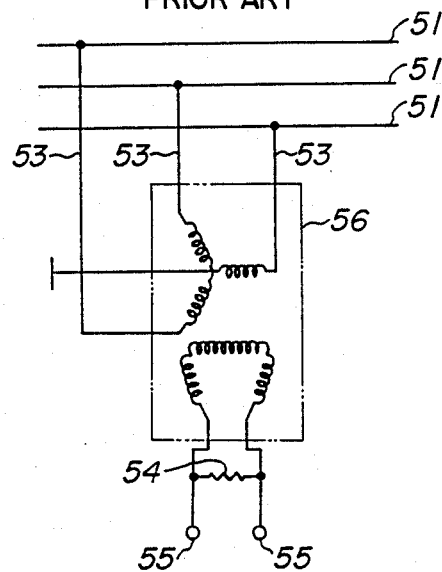

OPTICAL ZERO-PHASE CURRENT AND ZERO PHASE VOLTAGE SENSING ARRANGEMENT

BACKGROUND OF THE INVENTION

1. Field of the Invention

The present invention relates to an apparatus for detecting a line accident such as a short circuit of a line and a short with a ground of line, utilizing an optical sensor for detecting or measuring a zero-phase current or a zero-phase voltage in a transmission line or a distribution line.

2. Related Art Statement

Recently, it is necessary to keep an accurate and prompt power supply to satisfy a variety of demands for the power supply. Correspondingly, the supply of electric power and the management institution thereof are complicated and varied, and thus promote development of a practical automatic system. Moreover, the collection of information for this power supply, e.g. the detection and measurement of voltage and current in a line, must be performed in an accurate and prompt manner at a plurality of points.

Heretofore, apparatus for detecting a short circuit in a line such as a polyphase AC line, particularly a three-phase AC line, are known such as the apparatus for detecting and measuring the zero-phase current or the zero-phase voltage shown in FIGS. 4 and 5.

As shown in FIG. 4, in the apparatus for detecting and measuring the zero-phase current, lead wires 53 of respective current transformers 52 arranged in an electric wire 51 are connected in series, and a resistor 54 is connected to both ends of the series lead wires 53. Then, a voltage in response to a current variation in respective electric wires 51 is generated at output terminals 55, 55.

In the apparatus having the above mentioned construction, the electric signal normally supplied from the output terminals 55, 55 is the zero-phase current in which a sum of current phases is zero. However, when a line accident occurs, the electric signal supplied from the output terminals 55, 55 does not indicate a zero value, and the electric signal in response to a scale of line accident is generated.

Contrary to this, in the apparatus for detecting and measuring the zero-phase voltage shown in FIG. 5, a resistor 54 is connected to lead wires 53 of a three-phase voltage transformer or three single-phase voltage transformers 56 whose first terminals are connected to electric wires 51 in Y connection, and a voltage in response to a current variation in respective electric wires 51 is generated at output terminals 55, 55.

In the apparatus having the above mentioned construction, the electric signal normally supplied from the output terminals 55, 55 is the zero-phase voltage in which a sum of voltage phases is zero. However, when a line accident occurs, the electric signal output from the output terminals 55, 55 does not indicate a zero value, and the electric signal in response to a scale of line accident is generated.

In this manner, the line accident is detected by detecting and measuring the zero-phase current or the zero-phase voltage or further both zero-phase current and voltage.

However, in the known apparatuses mentioned above, since electromagnetic induction is induced in the lead wires 53 of the current transformer 52 or the voltage transformer 56, there occurs the drawback that the S/N ratio is decreased and thus the measurement accuracy becomes bad. Especially, since it is necessary to improve the reliability of the transmission line and the distribution line to detect accidents such as instant short with ground of line, or intermittent short with ground of line, which cannot be detected until now, the highly precise detection of line voltage or line current must be realized. Moreover, there occur the drawbacks that the short circuiting of the line happens to be due to the superannuation of the lead wire 53 and the short with ground of line happen to be due to the breakage of insulation of the current transformer 52 or the voltage transformer 56.

SUMMARY OF THE INVENTION

The object of the present invention is to eliminate the drawbacks mentioned above and to provide an apparatus for detecting a line accident which has a good S/N ratio and a high measurement accuracy.

According to the invention, an apparatus for detecting an accident of electric wire lines comprises a single light emitting element for emitting a light, a light dividing means for dividing the light emitted from said light emitting element into a plurality of lights, the number of which correspond to the number of the electric wire lines to be observed, a plurality of optical sensor heads arranged respectively to the lines to be observed, for modulating the light supplied from said light dividing means through a light transmission line in response to electric variations in the line to obtain the light including a direct current component and an alternating current component, a light synthetic means for adding the lights supplied from said optical sensor heads through light transmission lines, and a single light receiving element for receiving the light supplied from said light synthetic means.

In the construction mentioned above, since both the light transmission line and the optical elements are made of insulating material, the insulation reliability of the apparatus can be improved and the electromagnetic induction in the line can be preferably eliminated.

Further, since use is made of a single light emitting element and a single light receiving element, a change for the worse of the measurement accuracy due to variations in characteristics of the light emitting elements and the light receiving elements generated when using a plurality of elements can be preferably eliminated. These variations in characteristics are originated from the environmental temperature in which the element is arranged or from aging of the element, and are especially remarkable in solid state elements. Moreover, in this construction, it is preferable to reduce the number of elements to be used.

As the light sensor head, it is preferable to use a known Pockels element sensitive to the voltage in the line or a known Faraday element sensitive to the magnetic field generated by a current flowing through the line, which changes the light attribution such as phase, polarized light, light intensity, etc. when the light passes therethrough.

BRIEF DESCRIPTION OF THE DRAWINGS

FIG. 1 is a schematic view illustrating a concept of the invention using a three-phase alternating current, FIGS. 2 and 3 are schematic views each showing one embodiment of an apparatus for detecting a line accident according to the invention, and FIGS. 4 and 5 are schematic views each illustrating one embodiment of a known apparatus for detecting a line accident.

DESCRIPTION OF THE PREFERRED EMBODIMENTS

At first, a sensor head according to the invention will be explained.

One embodiment of the sensor head according to the invention utilizing a Faraday element is constructed by a polarizer, a Faraday element and an analyzer where a light is transmitted through the above-mentioned components in the order listed.

A light transmitted through the polarizer becomes a linearly polarized light and is further transmitted through the Faraday element having a thickness of l. In this case, if a rotation angle $\theta$ with respect to a polarized surface is in direct proportion to or in substantially direct proportion to an external magnetic field, the following equation (1) is obtained, $$\theta = vHl \tag{1}$$

wherein v is Verdet constant, H is an intensity of magnetic field and l is a thickness of element.

An amount of light P after a light is transmitted through the analyzer is represented by the following equation (2) in case that the analyzer is inclined by 45° with respect to the polarizer.

$$P_{out} = \tfrac{1}{2} P_{in}(1 + \sin 2\theta) = \tfrac{1}{2} P_{in}\{1 + \sin 2(vHl)\} \tag{2}$$

Moreover, since a magnetic field H is in proportion to a current I flowing through the line of electric wire, the following equation is satisfied.

$$H = aI = AI_0 \sin \omega t$$

In this case, if it is assumed that A is a constant, Io is a maximum value of current, $\omega$ is an angular frequency and t is a time, the following equation (3) is obtained.

$$P_{out} = \tfrac{1}{2} P_{in}\{1 + \sin 2(vlaI)\} = \tfrac{1}{2} P_{in}\{1 + \sin 2(vlaI_0 \sin \omega t)\} \tag{3}$$

As a result, a light transmitted through the sensor head is modulated by an intensity corresponding to the current flowing through the line of electric wire.

Next, one embodiment of the sensor head according to the invention utilizing the Pockels element is constructed by polarizer, Pockels element, λ/4 plate and analyzer where light is transmitted through the above-mentioned elements in the order listed.

A light transmitted through the polarizer becomes a linearly polarized light and is further transmitted through the Pockels element. In this case, if an optical phase difference $\Phi$ is in direct proportion to or in substantially direct proportion to a voltage V applied to the Pockels element, the following equation (4) is obtained, $$\Phi = CVl \tag{4}$$

wherein C is a constant, V is an intensity of voltage and l is a length of the element.

An amount of light after a light is transmitted through the λ/4 plate and the analyzer is represented by the following equation (5) in case that the analyzer is inclined by 0° with respect to the polarizer.

$$P_{out} = \tfrac{1}{2} P_{in}\left(1 + \sin \frac{V}{V_{II}} \Pi \right) \tag{5}$$

wherein $V_{II}$ is a halfwavelength voltage necessary to modulate a light by 0–100%. Moreover, if it is assumed that the voltage V is in proportion to the voltage applied to the line of electric wire, $V_0$ is a maximum value of voltage and b is a constant, the following equation (6) is obtained.

$$P_{out} = \tfrac{1}{2} P_{in}\left\{1 + \sin\left(\frac{\Pi}{V_{II}} bV_0 \sin \omega t\right)\right\} \tag{6}$$

As a result, a light transmitted through the sensor head is modulated by an intensity corresponding to the voltage of the line of electric wire.

Here, if it is assumed that the constant A of sin $\omega t$ in the equations (3) and (6) is small, the following approximation (7) is obtained.

$$P_{out} = \tfrac{1}{2} P_{in}\{1 + \sin(A \sin \omega t)\} \approx \tfrac{1}{2} P_{in}(1 + A \sin \omega t) \tag{7}$$

In this case, if vectors $\vec{I_1}, \vec{I_2}, \vec{I_3}$ representing respective three-phase alternating current are deviated from the normal state by $(\epsilon_1, \delta_1)$ and $(\epsilon_2, \delta_2)$, an amount of light P is represented as follows.

$$P \alpha P_1 + P_2 + P_3$$

$$P_3 = \tfrac{1}{3} P_0(\tfrac{1}{2} + vlaI_0 \sin \omega t)$$

$$P_2 = \tfrac{1}{3} P_0\{\tfrac{1}{2} + vla(I_0 + \epsilon_2) \sin(\omega t + 120° + \delta_2)\}$$

$$P_1 = \tfrac{1}{3} P_0\{\tfrac{1}{2} + vla(I_0 + \epsilon_1) \sin(\omega t + 240° + \delta_1)\} \tag{8}$$

If it is assumed that $\epsilon$ and $\delta$ are small, the following equation (9) is obtained.

$$P = \tfrac{1}{2} P_0 + \tfrac{1}{3} P_0 vla \sqrt{\alpha^2 + \beta^2} \sin(\omega t + \Gamma) \tag{9}$$

wherein $$\alpha = -\tfrac{1}{2}(\epsilon_1 + \epsilon_2) + \frac{\sqrt{3}}{2} I_0(\delta_1 - \delta_2)$$

$$\beta = \frac{\sqrt{3}}{2}(-\epsilon_1 + \epsilon_2) - \tfrac{1}{2} I_0(\delta_1 + \delta_2)$$

$$\Gamma = \frac{\beta}{\alpha}$$

Moreover, an amplitude $\Delta I$ of the zero-phase current is obtained as follows. Since the following equation is satisfied, $$\Delta I = \vec{I_1} + \vec{I_2} + \vec{I_3}$$

and thus $$\Delta I = \left\{ \left( \frac{\sqrt{3}}{2}(-\epsilon_1 + \epsilon_2) - \tfrac{1}{2} I_0(\delta_1 + \delta_2), -\tfrac{1}{2}(\epsilon_1 + \epsilon_2) + \right. \right.$$

$$\left. \frac{\sqrt{3}}{2} (\delta_1 + \delta_2) \right\} = (\alpha, \beta)$$

, therefore the following equation (10) is obtained.

$$\Delta I = \sqrt{\alpha^2 + \beta^2} \qquad (10)$$

From the equations (9) and (10), the following equation (11) is obtained.

$$P = \tfrac{1}{2} P_0 + \tfrac{1}{6} P_0 v l a \cdot \Delta I \cdot \sin(\omega t + \Gamma) \qquad (11)$$

As a result, an intensity of light P includes a DC component and an AC component in response to the zero-phase current.

From the above explanations, an intensity of light P for a plurality of electric wire lines is represented as follows.

$$P = \frac{1}{2} P_0 + \frac{1}{6} P_0 \frac{II}{V_{II}} b V_0 \cdot \Delta V \sin(\omega t + \Gamma)$$

Therefore, an intensity of light P includes a DC component and an AC component in response to the zero-phase voltage.

Further, to improve the measurement accuracy of the apparatus according to the invention, it is possible to eliminate $P_0$ component from the equations (11) and (12) by using a circuit construction in which a light intensity received by the light receiving element is converted into an electric signal and a ratio between the AC component and the DC component is calculated. In this case, since variations in the light emitting element and the light receiving element can be reduced, it is possible to detect the zero-phase current or the zero-phase voltage more accurately.

In order to further improve the measurement accuracy of the apparatus according to the invention, it is possible to use a circuit construction in which a light emitted from the light emitting element is overlapped with an alternating current or a pulse whose frequency is higher than that of the alternating current flowing through the line and these frequencies are synchronized in a side of the light receiving element.

As the light emitting element, use is made of a light-emitting diode, a semiconductor laser, a gas laser, etc. Moreover, as the light receiving element, a photodiode, a phototransistor, a photomultiplier tube, etc.

Further, in case that a device for adjusting a light amount is arranged in the light transmission line, it is possible to make a light amount passing through respective light transmission lines equal by means of the device mentioned above, and thus the zero-phase current and the zero-phase voltage can be detected in an accurate manner.

Now, the present invention will be explained with reference to the drawings.

FIG. 1 is a schematic view for explaining a conception of the invention by using a three-phase alternating current. At first, a light $P_0$ emitted from single light emitting element 1 is divided into three equal parts by means of a light dividing means 2 such as a beam splitter etc. The thus divided lights are respectively incident upon optical sensor heads 4-1 to 4-3 arranged in alternating current lines 3-1 to 3-3 through light transmission lines 5-1 to 5-3. Then, lights $P_1$, $P_2$ and $P_3$ modulated respectively by the light sensor heads 4-1 to 4-3 in response to current variations in the alternating current lines 3-1 to 3-3 are added with each other by a light synthetic means 7 through light transmission lines 6-1 to 6-3 to obtain a sum of lights P. Finally, the light P is made incident upon a single light receiving element 8, and an alternating current component corresponding to an amplitude of the zero-phase current or the zero-phase voltage is detected.

Embodiment 1

FIG. 2 is a schematic view showing one embodiment of the apparatus according to the invention utilizing the Faraday element in which three-phase alternating current is used. In this embodiment, as a light emitting element 11 use is made of InGaAsP LED (wavelength $\lambda = 1.3$ μm), and as a light receiving element 12 use is made of InGaAs PIN-PD. Optical sensor heads 12-1 to 12-3 are respectively constructed by Faraday elements 13-1 to 13-3 made of YIG ($Y_3Fe_5O_{12}$), polarizers 14-1 to 14-3, analyzers 15-1 to 15-3, rod lenses 16-1 to 16-3, 17-1 to 17-3 and attenuators 19-1 to 19-3 for adjusting a ratio between light amounts in light transmission lines 18-1 to 18-3 made of an optical fiber. Moreover, the optical sensor heads 12-1 to 12-3 are respectively arranged near electric wire lines 20-1 to 20-3.

In the construction mentioned above, magnetic fields of alternating current generated by the currents flowing through the lines 20-1 to 20-3 are respectively applied to the Faraday elements 13-1 to 13-3, and the lights transmitted through the optical sensor heads are modulated on intensity by utilizing the Faraday effects. Therefore, one third of the light emitted from the light emitting element 11 is supplied to respective light transmission lines 18-1 to 18-3 by means of a light dividing means 23, and the lights transmitted through the optical sensor heads 12-1 to 12-3 are modulated on intensity and then synthesized by a light synthetic means 24. Then, the thus synthesized light is made incident upon a light receiving element 21. Further, attenuators 19-1 to 19-3 function to make the light amount incident upon respective Faraday elements equal.

The light incident upon the light receiving element 21 normally consists of the direct current component. If the accident occurs in the lines 20-1 to 20-3, the zero-phase current is generated and thus the light incident upon the light receiving element 21 includes the alternating current component in response to the zero-phase current. Finally in a converter 22, an output of the light receiving element 21 is converted into an electric signal to divide the alternating current output by the direct current output. In this manner, it is possible to eliminate the error cause of the light emitting element 11 utilizing LED.

Embodiment 2

FIG. 3 is a schematic view showing one embodiment of the apparatus according to the invention utilizing the Pockels element in which three-phase alternating current is used. In this embodiment, as a light emitting element 31 use is made of AlGaAs LED (wavelength $\lambda = 0.85$ μm), and as a light receiving element 44 use is made of Si PIN-PD. Optical sensor heads 32-1 to 32-3 are respectively constructed by Pockels elements 33-1 to 33-3 made of $LiNbO_3$, polarizers 34-1 to 34-3, analyzers 35-1 to 35-3, λ/4 plate 36-1 to 36-3, rod lenses 37-1 to 37-3; 38-1 to 38-3 and attenuators 40-1 to 40-3 for adjusting a ratio between light amounts in light transmission lines 39-1 to 39-3 made of an optical fiber. Moreover, the voltage in respective electric wire lines 41-1 to 41-3 is divided by means of capacitors $C_{11}$ to $C_{13}$ and $C_{21}$ to $C_{23}$ arranged with respect to the earth. The voltages generated at both ends of the capacitors $C_{11}$ to $C_{13}$ are applied to electrodes 42-1 to 42-3; 43-1 to 43-3 formed in the Pockels elements 33-1 to 33-3.

In the construction mentioned above, the alternating current is applied to the Pockels elements 33-1 to 33-3 from the electric wire lines 41-1 to 41-3, and the lights transmitted through the optical sensor heads are modulated on phase by utilizing the Pockels effects. Therefore, one third of the light emitted from the light emitting element 31 is supplied to respective light transmission lines 39-1 to 39-3 by means of a light dividing means 46, and the lights transmitted through the optical sensor heads 32-1 to 32-3 are modulated on intensity and then synthesized by a light synthetic means 47. Then, the thus synthesized light is made incident upon a light receiving element 44. Further attenuators 40-1 to 40-3 function to make the light amount incident upon respective Pockels elements 33-1 to 33-3 equal.

The light incident upon the light receiving element 44 normally consists of the direct current component. If the accident occurs in the lines 41-1 to 41-3, the zero-phase voltage is generated and thus the light incident upon the light receiving element 44 includes the alternating current component in response to the zero-phase voltage. Finally in a converter 45, an output of the light receiving element 44 is converted into an electric signal to divide the alternating current output by the direct current output. In this manner, it is possible to eliminate the error cause of the light emitting element 31 utilizing LED.

The present invention is not limited to the embodiment mentioned above, but various modifications are possible. For example, in the embodiments mentioned above, use is made of the Faraday element or the Pockels element for detecting the zero-phase current or the zero-phase voltage, it is possible to use an interferometer utilizer optical fibers disclosed, for example, in U.S. Pat. No. 4,370,612 for this purpose.

As explained above in detail, according to the invention, since use is made of the optical fiber as the light transmission line, it is possible to obtain the apparatus having high insulation characteristics. Moreover, since use is made of single light emitting element and single light receiving element, it is possible to obtain high S/N ratio and high measurement accuracy.

What is claimed is:

1. An apparatus for detecting a fault in electric wire lines comprising:
   a single light emitting element;
   a light dividing means for dividing light emitted from said light emitting element, and for supplying said divided light through first respective light transmission lines wherein the divided light corresponds to a number of electric wire lines to be observed;
   a plurality of optical sensor heads arranged respectively to the lines to be observed, for modulating said divided light in response to electric variations in the electric wire lines to obtain a direct current component and an alternating current component of the light supplied from said light dividing means, and for supplying said modulated light through second respective light transmission lines;
   a light synthetic means for adding the modulated light supplied from said optical sensor heads through said second respective light transmission lines; and
   a single light receiving element for receiving the light supplied from said light synthetic means and for detecting an alternating current component of the added modulated light corresponding to an amplitude of zero-phase current or zero-phase voltage of the electric lines, wherein said zero-phase current or voltage indicates a fault in said electric lines.

2. An apparatus according to claim 1, wherein said optical sensor head comprises a rod lens, a polarizer for polarizing the light, a Faraday element for modulating the light on polarization in response to an A.C. magnetic field generated by a current flowing through the electric wire line, an analyzer for analyzing the light and a rod lens.

3. An apparatus according to claim 2, further comprising an attenuator for adjusting an amount of light incident on said Faraday element in order to make said amount of light incident on respective Faraday elements equal.

4. An apparatus according to claim 2, wherein a modulation characteristic of said sensor head is in direct proportion to or in substantially direct proportion to a current of the electric wire line.

5. An apparatus according to claim 1, wherein said optical sensor head comprises a rod lens, a polarizer for polarizing the light, a Pockels element for modulating the light on phase in response to the voltage of line with respect to the earth, a quarter wavelength plate, an analyzer for analyzing the light, and a rod lens.

6. An apparatus according to claim 5, further comprising an attenuator for adjusting an amount of light incident on said Pockels element in order to make said amount of light incident on respective Pockels elements equal.

7. An apparatus according to claim 5, wherein a modulation characteristic of said sensor head is in direct proportion to or in substantially direct proportion to a voltage of the electric wire line.

8. An apparatus according to claim 1, said light transmission line comprises an optical fiber.

9. An apparatus according to claim 1, further comprising a converter for converting the output of said light receiving element into an electric signal to divide the alternating current output by the direct current output.

* * * * *